(12) United States Patent
Tomczak et al.

(10) Patent No.: US 12,469,703 B2
(45) Date of Patent: Nov. 11, 2025

(54) METHODS FOR FORMING SPACERS AND RELATED STRUCTURES

(71) Applicant: ASM IP Holding, B.V., Almere (NL)

(72) Inventors: Yoann Tomczak, Leuven (BE); Kishan Ashokbhai Patel, Leuven (BE)

(73) Assignee: ASM IP Holding B.V., Almere (NL)

( * ) Notice: Subject to any disclaimer, the term of this patent is extended or adjusted under 35 U.S.C. 154(b) by 237 days.

(21) Appl. No.: 18/166,879

(22) Filed: Feb. 9, 2023

(65) Prior Publication Data

US 2023/0268179 A1 Aug. 24, 2023

Related U.S. Application Data

(60) Provisional application No. 63/312,915, filed on Feb. 23, 2022.

(51) Int. Cl.
*H01L 21/033* (2006.01)

(52) U.S. Cl.
CPC .............................. *H01L 21/0337* (2013.01)

(58) Field of Classification Search
None
See application file for complete search history.

(56) References Cited

U.S. PATENT DOCUMENTS

| | | |
|---|---|---|
| 10,770,294 B2 * | 9/2020 | O'Meara ........... H01L 21/02164 |
| 2010/0301486 A1 | 12/2010 | Frohberg |
| 2022/0216050 A1* | 7/2022 | Yu ...................... H01L 21/02274 |

\* cited by examiner

*Primary Examiner* — Roberts P Culbert
(74) *Attorney, Agent, or Firm* — Banner & Witcoff, Ltd.

(57) ABSTRACT

Methods for patterning and forming structures, as well as related structures and systems are disclosed. The methods comprise forming a liner on sidewalls of a patterned resist. The patterned resist comprises a first metal, and the liner comprises a second metal.

17 Claims, 13 Drawing Sheets

METHODS FOR FORMING SPACERS AND RELATED STRUCTURES

FIELD OF INVENTION

The present disclosure generally relates to the field of lithography, and particularly to the field of extreme ultraviolet lithography.

BACKGROUND OF THE DISCLOSURE

With the constant scaling of semiconductor devices, and the associated reduction of the critical dimensions (CD) of their constituent structures, conventional extreme ultraviolet (EUV) lithography scanners are reaching their resolution limit: certain types of isolated structure patterns (in particular, contacts and holes for vias), cannot be printed at the target critical dimensions of less than 20 nm. Accordingly, the actual critical dimension after EUV lithographic exposure is about 20 nm, higher than targeted critical dimension (CD).

With the scaling down of EUV feature size, new resist types were recently introduced. In particular, Metal Organic Resist (MOR) are gaining traction as they exhibit higher etch resistance which allows for thinner photoresist layers and thus easier pattern transfer with less defectivity (especially at the smallest CDs and pitch). However, these resists still suffer from the same EUV resolution limitation (for instance minimum printed CD size~20 nm for isolated Contact/Holes structures) as their Chemically Amplified Resist (CAR) counterparts (C based photoresist).

The presently disclosed methods and structures provide a solution for at least some of the above-mentioned challenges.

SUMMARY OF THE DISCLOSURE

Various embodiments of the present disclosure relate to methods for forming structures. The methods comprise providing a substrate to a reaction chamber. The substrate comprises a patterned resist. The patterned resist comprises a first metal. The patterned resist further comprises a plurality of patterned features and a plurality of recesses. The plurality of recesses comprise sidewalls and bottom portions. The methods further comprise forming a liner on the sidewalls. The liner comprises a second metal.

Further described herein are methods for forming a pattern on a substrate. The methods comprise forming a resist on a substrate. The resist comprises a first metal. The method further comprises partially exposing the substrate to radiation through a mask. Accordingly, exposed resist portions and unexposed resist portions are formed. The method further comprises selectively removing one of the exposed resist portions and unexposed resist portions. Thus, a patterned resist is formed. The patterned resist comprises the first metal. The patterned resist further comprises a plurality of patterned features and a plurality of recesses. The plurality of recesses comprise sidewalls and bottom portions. The method further comprises providing the substrate to a reaction chamber. The method further comprises forming a liner on the sidewalls. The liner comprises a second metal.

In some embodiments, the resist comprises an EUV resist and the radiation comprises EUV radiation.

In some embodiments, the first metal and the second metal are the same.

In some embodiments, the liner is further formed on the patterned features and the bottom portions of the recesses.

In some embodiments, the step of forming the liner is further followed by etching the liner. Thus, the liner is removed from the patterned features and the bottom portions of the recesses, and forming spacers on the sidewalls.

In some embodiments, at least one of the first metal and the second metal is selected from Sn, In, Sb, Ti, Al, Zn, Hf, and Zr.

In some embodiments, the liner and the resist have a substantially identical composition.

In some embodiments, the liner and the resist have a substantially identical etch rate.

In some embodiments, at least one of the resist and the liner comprise one or more of a pnictogen, a chalcogen, and a halogen.

In some embodiments, the resist and the liner comprise the same metal oxide.

In some embodiments, forming the liner comprises providing a precursor and a reactant to the reaction chamber.

In some embodiments, forming the liner comprises forming a plasma.

In some embodiments, the precursor and the reactant are simultaneously provided to the reaction chamber.

In some embodiments, forming the liner comprises executing a cyclical process. The cyclical process comprises a precursor pulse and a reactant pulse. The precursor pulse comprises exposing the substrate to the precursor. The reactant pulse comprises exposing the substrate to the reactant.

In some embodiments, the precursor comprises at least one of a metal alkylamine, a metal alkyl, and a metal halide.

In some embodiments, the reactant comprises oxygen.

Further described herein is a system that comprises one or more precursor sources, a reaction chamber operationally coupled with the one or more precursor sources, and a controller. The controller is arranged for causing the system to carry out a method as described herein.

Further described herein is a structure that comprises a substrate, a patterned resist, and a liner. The patterned resist comprises a first metal. The patterned resist further comprises a plurality of patterned features and a plurality of recesses. The plurality of recesses comprise sidewalls and bottom portions. The liner is positioned on the sidewalls. The liner comprises a second metal.

Further described herein is a structure that is formed by means of a method as described herein.

These and other embodiments will become readily apparent to those skilled in the art from the following detailed description of certain embodiments having reference to the attached figures; the invention not necessarily being limited to any particular embodiment(s) disclosed.

BRIEF DESCRIPTION OF THE FIGURES

A more complete understanding of exemplary embodiments of the present disclosure can be derived by referring to the detailed description and claims when considered in connection with the following illustrative figures.

Figure 1:
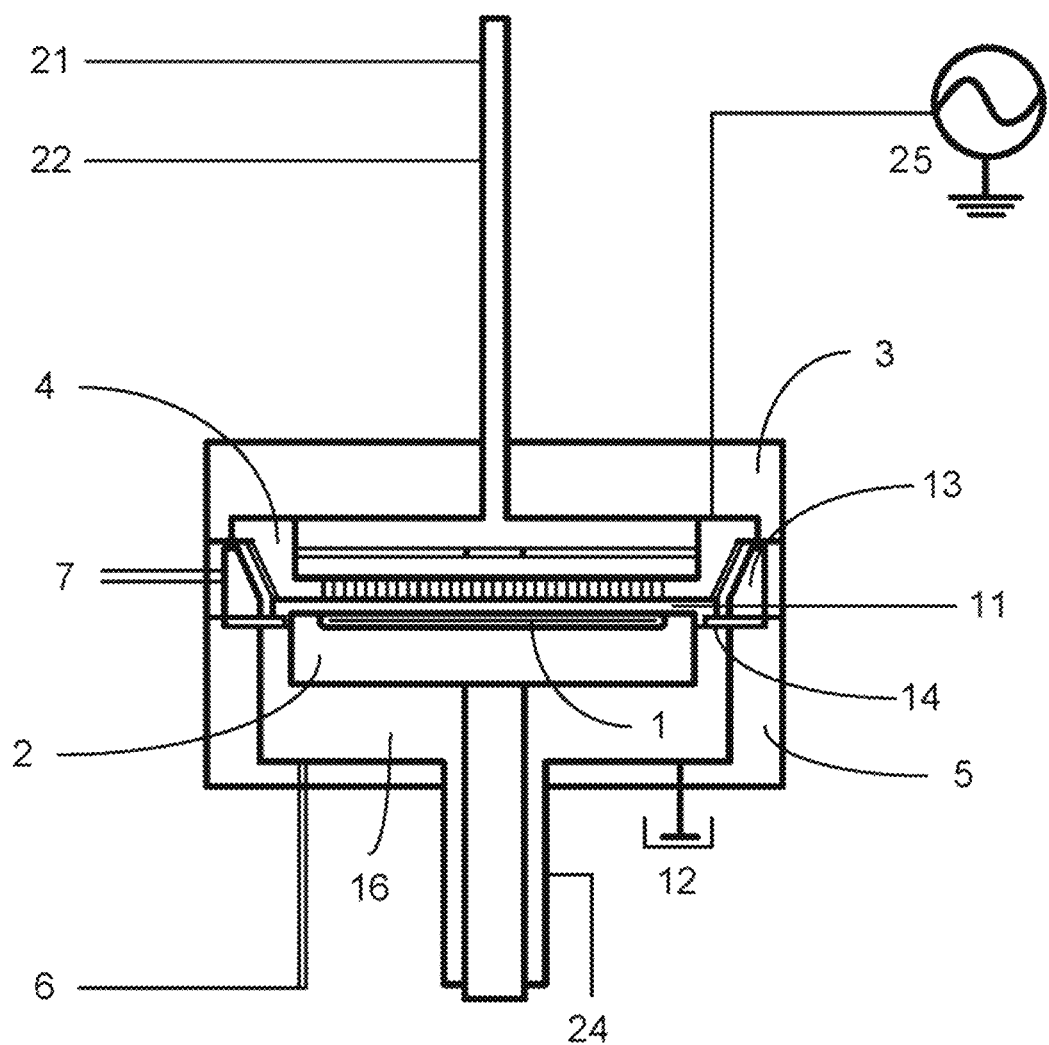
FIG. 1 shows a reactor in which at least embodiments of methods according to the present disclosure can be executed.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of the present invention provided below is merely exemplary and is intended for purposes of illustration only; the following description is not intended to limit the scope of the invention disclosed herein. Moreover, recitation of multiple embodiments having stated features is not intended to exclude other embodiments having additional features or other embodiments incorporating different combinations of the stated features.

As used herein, the term substrate may refer to any underlying material or materials including and/or upon which one or more layers can be deposited. A substrate can include a bulk material, such as silicon (e.g., single-crystal silicon), other Group IV materials, such as germanium, or compound semiconductor materials, such as GaAs, and can include one or more layers overlying or underlying the bulk material. For example, a substrate can include a patterning stack of several layers overlying bulk material. The patterning stack can vary according to application and can include, for example, a hard mask, such as a metal hard mask, an oxide hardmask, a nitride hardmask, a carbide hardmask, or an amorphous carbon hardmask. Further, the substrate can additionally or alternatively include various features, such as recesses, lines, and the like formed within or on at least a portion of a layer of the substrate.

In this disclosure, gas may include material that is a gas at normal temperature and pressure, a vaporized solid and/or a vaporized liquid, and may be constituted by a single gas or a mixture of gases, depending on the context. A gas other than the process gas, i.e., a gas introduced without passing through a gas distribution assembly, such as a showerhead, other gas distribution device, or the like, may be used for, e.g., sealing the reaction space, and may include a seal gas, such as a noble gas.

In some cases, such as in the context of deposition of material, the term precursor can refer to a compound or compounds that participates in the chemical reaction that produces another compound, and particularly to a compound that constitutes a film matrix or a main skeleton of a film, whereas the term reactant can refer to a compound, in some cases other than precursors, that reacts with the precursor, activates the precursor, modifies the precursor, or catalyzes a reaction of the precursor; a reactant may provide an element to a film and become a part of the film. In some cases, the terms precursor and reactant can be used interchangeably.

The term cyclic deposition process or cyclical deposition process may refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component. In other cases, the processing techniques may include a plasma process such as plasma enhanced CVD (PECVD) or plasma enhanced ALD (PEALD), which may be preferred in some implementations because they allow working at lower temperatures.

The term atomic layer deposition may refer to a vapor deposition process in which deposition cycles, typically a plurality of consecutive deposition cycles, are conducted in a process chamber. The term atomic layer deposition, as used herein, is meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term purge or purging may refer to a procedure in which gas flow is stopped or a procedure involving continual provision of a carrier gas whereas precursor flow is intermittently stopped. For example, a purge may be provided between a precursor pulse and a reactant pulse, thus avoiding, or at least reducing, gas phase interactions between the precursor and the reactant. It shall be understood that a purge can be effected either in time or in space or both. For example, in the case of temporal purges, a purge step can be used, e.g., in the temporal sequence of providing a precursor to a reactor chamber, providing a purge gas to the reactor chamber, and providing a reactant to the reactor chamber, wherein the substrate on which a layer is deposited does not move. In the case of spatial purges, a purge step can take the form of moving a substrate from a first location to which a precursor is supplied, through a purge gas curtain, to a second location to which a reactant is supplied.

In this disclosure, any two numbers of a variable can constitute a workable range of the variable, and any ranges indicated may include or exclude the endpoints. Additionally, any values of variables indicated may refer to precise values or approximate values and include equivalents, and may refer to average, median, representative, majority, etc. in some embodiments. Further, in this disclosure, the terms including, constituted by and having can refer independently to typically or broadly comprising, comprising, consisting essentially of, or consisting of in some embodiments. Further, the term comprising can include consisting of or consisting essentially of. In accordance with aspects of the disclosure, any defined meanings of terms do not necessarily exclude ordinary and customary meanings of the terms.

Described herein is a method for forming a structure. The method comprises providing a substrate to a reaction chamber. The substrate comprises a patterned resist. The patterned resist comprises a first metal. The patterned resist further comprises a plurality of patterned features and a plurality of recesses. The recesses comprise sidewalls and bottom portions. The method further comprises forming a liner on the sidewalls. The liner comprises a second metal.

Further described herein is a method for forming a pattern on a substrate such as a wafer. The method comprises forming a resist on the substrate. Exemplary resists include EUV resists, i.e. resists that are sensitive to extreme ultraviolet light. The resist comprises a first metal. The method further comprises partially exposing the substrate to radiation through a mask. When a substrate is partially exposed, certain parts of the substrate are illuminated while other parts are not. Thus, exposed resist portions and unexposed resist portions are formed. The method further comprises selectively removing one of the exposed resist portions and the unexposed resist portions. It shall be understood that both positive resists and negative resists can be suitably employed. Thus, a patterned resist is formed. The patterned resist comprises the first metal. The patterned resist further comprises a plurality of patterned features and a plurality of recesses. The plurality of recesses comprise sidewalls and bottom portions. The method further comprises providing the substrate to a reaction chamber. Then, a liner is formed on the sidewalls. The liner comprises a second metal.

Thus, described herein are methods for forming spacers, and methods for forming a pattern on a substrate. Further described herein are related structures and systems. The spacers can be advantageously employed in the context of patterning semiconductor substrates, for example using extreme ultraviolet (EUV) light. In particular, the spacers advantageously allow reducing the critical dimension of features that can be patterned. Accordingly, patterns having a critical dimension of less than 20 nm can be efficiently formed, thereby circumventing current EUV resolution limits.

In addition, as the spacer formation can be suitably performed directly after lithography, subsequent etch steps can use a "straight" anisotropic etch, i.e. an anisotropic etch perpendicular to the substrate plane with limited use of polymerizing gas and no tapering, thus potentially improving features uniformity and placement and limit defects. The presently disclosed methods can additionally result in patterns having a low roughness, reduced costs, and increased throughput.

Furthermore, a wide variety of materials, e.g. metal centers and co-reactants, can be employed such that the liner composition can be specifically selected such that a liner is formed which has a similar or identical etch rate as the patterned resist on which it is formed.

A method as described herein can employ any suitable resist. In some embodiments, the resist is a resist that is sensitive to extreme ultraviolet radiation (EUV resist). Suitably, the radiation employed for partially exposing the substrate to radiation through a mask. An EUV photoresist layer may include any suitable photoresist, such as molecular, metal oxide, or chemically amplified photoresist. It shall be understood that the photoresists can be formed using any suitable deposition technique, including chemical vapor deposition (CVD), plasma-enhanced chemical vapor deposition (PECVD), atomic layer deposition (ALD), and plasma-enhanced atomic layer deposition (PEALD).

In some embodiments, the resist comprises a metalorganic resist (MOR). Suitable metalorganic resists include tin oxycarbide and indium oxycarbide resists. Such resists can be formed using a variety of techniques including spin coating, chemical vapor deposition, plasma-enhanced chemical vapor deposition, atomic layer deposition, molecular layer deposition, and plasma-enhanced atomic layer deposition.

In some embodiments, the resist comprises a metal oxide resists. Suitable metal oxide resists include tin oxide resists and indium oxide resists. Such resists can be formed using a variety of techniques including spin coating, chemical vapor deposition, plasma-enhanced chemical vapor deposition, atomic layer deposition, molecular layer deposition, and plasma-enhanced atomic layer deposition. The resist can, in some embodiments, comprise an oxide of at least one of tin, indium, and antimony.

The resist suitable comprises a material that undergoes a physical or chemical change, e.g. a change in solubility, upon exposure to one or more kinds of electromagnetic radiation, e.g. EUV radiation.

A wide variety of materials (metal centers and co-reactants) allow for specific tailoring of the liner layer composition to adapt to specific resist compositions and subsequent etch chemistries. Thus in some embodiments, the first and second metals are the same. Thus, the resist and the liner can comprise the same metal. In other embodiments, the first and second metals are different, that is the resist and liner comprise dissimilar metals, but the resist and liner do exhibit similar or identical etch rates, e.g. in a vapor-phase etch.

In some embodiments, the first metal and the second metal are the same. This can be advantageous when, for example, a liner is formed which has a similar or identical etch rate as the patterned resist on which it is formed.

In some embodiments, the liner is further formed on the patterned features and the bottom portions of the recesses. Suitably, and in some embodiments, a method as described herein then comprises a step of anisotropically etching the liner, thus removing the liner from the patterned features and the bottom portions, and forming spacers on the sidewalls.

It shall be understood that the density and etch resistance of the liner can be tailored by adapting the deposition parameters (for instance deposition temperature, pressure, plasma composition, etc.), precursor selection, reactant composition, etc.

In some embodiments, at least one of the first metal and the second metal is selected from Sb, In, and Sn.

In some embodiments, at least one of the resist and the liner comprise one or more of a pnictogen, a chalcogen, and a halogen. In some embodiments, at least one of the resist and the liner comprises a metal pnictogen, a metal chalcogen, or a metal halide. Suitable metal pnictogens include metal nitrides. Suitable metal chalcogens include metal oxides, metal sulfides, metal selenides, and metal tellurides.

Suitable precursors include metal precursors such as tin precursors, antimony precursors, and indium precursors. In some embodiments, the precursor comprises an element selected from the list consisting of Sn, In, Sb, Ti, Al, Zn, Hf, and Zr. The metal precursors can, for example, comprise alkylamines, alkyls, or halides. In some embodiments the precursor comprises a tin alkylamine such as tetrakis(dimethylamido)tin. In some embodiments, the precursor comprises an indium alkyl such as trimethylindium. In some embodiments, the precursor comprises a tin halide such as $SnI_4$. In some embodiments, the precursor comprises an antimony halide such as $SbCl_5$.

Suitable reactants include gaseous compounds and elemental gasses that can react or otherwise interact with the precursor. The reaction between a reactant and a precursor can either be thermal or it can be activated through some activation means such as a plasma, hot wire, or UV light.

In some embodiments the reactant comprises oxygen. Thus, in some embodiments, the reactant comprises an oxygen reactant. Suitable oxygen reactants include $O_2$, $O_3$, and $H_2O$.

In some embodiments, the reactant includes a halide, such as one or more of F, Cl, Br, and I. In some embodiments, the reactant comprises a hydrogen halide such as HF, HCl, HBr, or HI. In some embodiments, the reactant comprises an elementary halogen such as $F_2$, $Cl_2$, $Br_2$, or $I_2$.

In some embodiments, the reactant comprises a nitrogen reactant. Suitable nitrogen reactants include $N_2$, $NH_3$, $N_2H_2$, and forming gas.

In some embodiments, the reactant comprises a carbon reactant. Suitable carbon reactants include alkyls such as $CH_4$.

In some embodiments, the reactant comprises a reducing reactant. Suitable reducing reactants include $H_2$.

In some embodiments, the reactant comprises a diol, such as an aliphatic or aromatic diol. Suitable diols include ethylene glycol and hydroquinone.

In some embodiments, the reactant comprises at least one of ions and radicals. The ions and radicals can be generated in a plasma, for example in a plasma in the reaction chamber or in a remote plasma at a certain distance from the reaction chamber. When the plasma is generated in the reaction chamber, the plasma can be a direct or an indirect plasma. A direct plasma is in direct contact with the substrate. An indirect plasma is separated from the substrate by means of a separator comprising openings such as a mesh plate or a perforated plate. In some embodiments, the plasma employs a plasma gas that comprises a noble gas, or a plasma gas that comprises a noble gas and an oxygen-containing gas, or a plasma gas that comprises Ar and $O_2$, or a plasma gas that comprises $O_2$, or a plasma gas that comprises He and $O_2$, or a plasma gas that comprises Ar.

In some embodiments, forming a liner comprises executing an atomic layer deposition process. In such embodiments, the liner is formed by sequentially exposing the substrate to precursor and reactant. Substrate and reactant exposures can be separated by a purge. The precursor can comprise an alkylamine such as tetrakis(dimethylamido)tin, an alkyl such as trimethylindium, or a halide such as $SnI_4$ or $SbCl_5$. The reactant can comprise a reactant comprising water and oxygen such as $H_2O$ or $H_2O_2$. Such atomic layer deposition processes are useful, for example, for forming liners on metalorganic resists that were deposited using plasma-enhanced chemical vapor deposition processes.

In some embodiments, forming a liner comprises executing a molecular layer deposition process. In such embodiments, the liner is formed by sequentially exposing the substrate to precursor and reactant. Substrate and reactant exposures can be separated by a purge. The precursor can comprise an alkylamine such as tetrakis(dimethylamido)tin, an alkyl such as trimethylindium, or a halide such as a iodide, a bromide, or chloride. Suitable iodides include $SnI_4$. Suitable chlorides include $SbCl_5$. The reactant can comprise a diol, e.g. an aliphatic diol such as ethylene glycol or an aromatic diol such as hydroquinone. Such molecular layer deposition processes are useful, for example, for forming liners on metalorganic resists that were formed using spin-coating.

In some embodiments, forming a liner comprises executing a plasma-enhanced atomic layer deposition process. In such embodiments, the liner is formed by sequentially exposing the substrate to precursor and a reactant. In such embodiments, the reactant comprises active species such as ions and radicals that were generated using a plasma. Substrate and reactant exposures can be separated by a purge. The precursor can comprise an alkylamine such as tetrakis(dimethylamido)tin, an alkyl such as trimethylindium, or a halide such as a iodide, a bromide, or a chloride. Suitable iodides include $SnI_4$. Suitable chlorides include $SbCl_5$. As mentioned, the ions and radicals can be generated in a plasma, for example in a plasma in the reaction chamber or in a remote plasma at a certain distance from the reaction chamber. When the plasma is generated in the reaction chamber, the plasma can be a direct or an indirect plasma. In some embodiments, the plasma employs a plasma gas that comprises a noble gas, or a plasma gas that comprises a noble gas and an oxygen-containing gas, or a plasma gas that comprises Ar and $O_2$, or a plasma gas that comprises $O_2$, or a plasma gas that comprises He and $O_2$, or a plasma gas that comprises Ar. Such plasma-enhanced atomic layer deposition processes are useful, for example, for forming liners on metalorganic resists that were deposited using plasma-enhanced chemical vapor deposition processes.

In some embodiments, forming the liner comprises providing a precursor and a reactant to the reaction chamber.

Exemplary deposition methods can be or include cyclical deposition methods, such as ALD and pulsed CVD methods, and can include, in some useful embodiments, indirect, direct, and remote plasma methods, which may include super cycle processes in which sub-cycles may be selectively repeated to enhance tuning (e.g., to achieve a desired amount or concentration of a desired element in the absorber or underlayer or the like). A liner as described herein can be formed using thermal chemical vapor deposition (CVD), pulsed CVD, thermal atomic layer deposition (ALD), plasma-enhanced CVD (PECVD), or plasma-enhanced ALD (PEALD). All these approaches may suitably provide for the deposition of thin 5 nm) liners with low non-uniformity.

In some embodiments, the liner is deposited by means of a cyclical process such as a molecular layer deposition process employing alternating pulses of a metal precursor and a carbon reactant. Suitably the metal precursor can include a metal alkylamine such as tetrakis(dimethylamido)tin, and the carbon reactant can comprise an aliphatic diol such as ethylene glycol or an aromatic diol such as hydroquinone. Such liners can be suitably used, for example, on tin oxycarbide resists.

In some embodiments, the liner is deposited by means of a cyclical process such as a molecular layer deposition process or an atomic layer deposition process comprising alternating pulses of a metal precursor and a carbon reactant. Suitably, the metal precursor can include a metal alkyl such as trimethylindium, and the carbon reactant can comprise an aliphatic diol such as ethylene glycol or an aromatic diol such as hydroquinone. Such liners can, for example, be suitably used on indium oxycarbide resists.

In some embodiments, forming the liner comprises forming a plasma. Various plasmas can be used, such as direct plasmas, indirect plasmas, and remote plasmas. The plasma can be generated continuously or intermittently.

In some embodiments, the precursor and the reactant are simultaneously provided to the reaction chamber. In some embodiments, no plasma is generated while forming the liner. The substrate can, in some embodiments, be continuously exposed to precursor and reactant. In other embodiments, the substrate can be alternatingly exposed to precursor and reactant.

In some embodiments, forming the liner comprises a cyclical process. The cyclical process comprises a precursor pulse and a reactant pulse. The precursor pulse comprises exposing the substrate to the precursor. The reactant pulse comprises exposing the substrate to the reactant.

In some embodiments, forming the liner comprises a thermal cyclical process such as a thermal atomic layer deposition process. The cyclical process comprises a precursor pulse and a reactant pulse. The precursor pulse comprises exposing the substrate to the precursor. The reactant pulse comprises exposing the substrate to the reactant. During a thermal cyclical process, the substrate is not exposed to plasma-generated active species such as plasma-generated ions or radicals.

In a thermal cyclical process, suitable precursors include metal alkylamines such as tetrakis(dimethylamido)tin, metal alkyls such as trimethylindium, and metal halides such as tin tetraiodide and antimony pentachloride.

In a thermal cyclical process, suitable reactants include oxygen and hydrogen-containing gasses or vapors such as $H_2O$ and $H_2O_2$. Other suitable reactants include oxygen-containing gasses such as $O_2$ and $O_3$.

Suitably, a thermal cyclical process employing a metal precursor and a reactant that comprises hydrogen result in liners that have an etch resistance that is similar to that of metal oxide-containing resists. For example, such liners can be suitably formed on patterned metal oxide resists that are deposited using plasma-enhanced chemical vapor deposition.

In some embodiments, forming the liner comprises a molecular layer deposition process. A molecular layer deposition process is a specific cyclical deposition process. The molecular layer deposition process comprises a precursor pulse and a reactant pulse. The precursor pulse comprises exposing the substrate to the precursor. The reactant pulse comprises exposing the substrate to the reactant. During a molecular layer deposition process, the substrate is not exposed to plasma-generated active species such as plasma-generated ions or radicals.

In a molecular layer deposition process, suitable precursors include metal alkylamines such as tetrakis(dimethylamido)tin, metal alkyls such as trimethylindium, and metal halides such as tin tetraiodide and antimony pentachloride.

In a molecular layer deposition process, suitable reactants include diols including alkyl diols such as ethylene glycol, 2-Butene-1,4-diol, and maleic acid; acyl halides such as succinyl chloride, fumaryl chloride; and aromatic diols or triols such as hydroquinone and Benzene-1,3,5-triol.

Suitably, a molecular layer deposition process as described herein can result in liners that have an etch resistance that is in between the etch resistance of a metal oxide resist and an organic resist. For example, such liners can be suitably formed on patterned resists that comprise a metal, oxygen, and optionally carbon, such as resists that are deposited using spin-coating techniques or metalorganic framework resists comprising metallic ions and coordinated organic ligands.

In some embodiments, forming the liner comprises a plasma-based cyclical process such as a plasma-enhanced atomic layer deposition process. The plasma-enhanced atomic layer deposition process comprises a precursor pulse and a plasma pulse. The precursor pulse comprises exposing the substrate to the precursor. The plasma pulse comprises generating a plasma and exposing the substrate to plasma-generated active species such as ions or radicals.

In a plasma-based cyclical process such as a plasma-enhanced atomic layer deposition process, suitable precursors include metal alkylamines such as tetrakis(dimethylamido)tin, metal alkyls such as trimethylindium, and metal halides such as tin tetraiodide and antimony pentachloride.

During a plasma pulse, a direct plasma or an indirect plasma can be used. Suitable plasmas include noble gas plasmas such as He and Ar plasmas. Other suitable plasmas include $O_2$ plasmas, and plasmas in which the plasma gas comprises a mixture of $O_2$ and a noble gas such as He or Ar.

Suitably, a plasma-enhanced cyclical deposition process as described herein can result in liners that have an etch resistance that is in between the etch resistance of a metal oxide resist and an organic resist. For example, such liners can be suitably formed on patterned resists that comprise a metal, oxygen, and optionally carbon, and that are deposited plasma-enhanced deposition techniques such as plasma-enhanced chemical vapor deposition.

In some embodiments, the step of forming the liner is further followed by a step of etching the liner. Optionally, the step of forming the liner comprises partially etching the resist. Suitably, the step of forming the liner employs an anisotropic etch, i.e. an etch that has a higher etch rate in a direction perpendicular to the substrate surface compared to directions parallel to the substrate surface. Accordingly, the liner is removed from the patterned features and the bottom portions of the recesses, and spacers are formed on the sidewalls.

In some embodiments, the liner and the resist have a substantially identical composition. The liner and resist can additionally have a similar microstructure. For example, resist and liner can both be amorphous, or they can both have a microcrystalline structure, or they can both have a polycrystalline structure. Advantageously, when microstructure and composition are similar or substantially identical, the resist and liner can then have similar etch rates, regardless of the etchant used.

In some embodiments, the liner and the resist have a substantially identical etch rate, e.g. when subject to etchants such as $NF_3$, $BCl_3$, $CF_4$, $CHF_3$, $SF_6$, HBr, $Cl_2$, and mixtures thereof. Such etchants can be employed using RIE (Reactive Ion Etch) inside a capacitively coupled plasma (CCP), inductively coupled plasma (ICP), or remote plasma chamber. An identical etch rate could also occur with wet etching, for instance using diluted HF or tetramethylammonium hydroxide (TMAH).

In some embodiments, the liner and the resist have a different composition, but an identical etch rate.

In some embodiments, the precursor comprises at least one of a metal alkylamine, a metal alkyl, and a metal halide.

While forming the liner, the reaction chamber can be maintained at a temperature of, for example from at least 20° C. to at most 200° C., or from at least 50° C. to at most 300° C. While forming the liner, the reaction chamber can be maintained, for example, at a pressure of at least 140 Pa to at most 1300 Pa. At least one of the precursor and the reactant can, for example, be provided at a flow rate of at least 200 to at most 2000 sccm. In some embodiments, a precursor pulse lasts from at least 0.1 s to at most 15 s.

Suitably, at least one of the temperature and the pressure of the reaction chamber can be maintained at a constant value throughout a method as described herein, for example within a margin of error of at most 10%.

Further described herein is a system that comprises one or more precursor sources, a reaction chamber that is operationally coupled with the one or more precursor sources, and a controller. The controller is arranged for causing the system to carry out a method as described herein.

Further described herein is a structure. The structure comprises a substrate, a patterned resist, and a liner. The patterned resist comprises a first metal. The patterned resist further comprises a plurality of patterned features and a plurality of recesses. The plurality of recesses comprise sidewalls and bottom portions. The liner is located on the sidewalls. The liner comprises a second metal. Advantageously, but not necessarily, the first metal and the second metal are identical. In some embodiments, the first metal and the second metal are Sn. In some embodiments, the first metal and the second metal are Sb. In some embodiments, the first metal and the second metal are In. In some embodiments, the structure is formed by means of a method as described herein.

The presently provided methods may be executed in any suitable apparatus, including in a reactor as shown in FIG. 1. Similarly, the presently provided structures may be manufactured in any suitable apparatus, including a reactor as shown in FIG. 1. FIG. 1 is a schematic view of a plasma-enhanced atomic layer deposition (PEALD) apparatus, desirably in conjunction with controls programmed to conduct the sequences described below, usable in some embodiments of the present invention. In this figure, by providing a pair of electrically conductive flat-plate electrodes (2,4) in parallel and facing each other in the interior (11) (reaction zone) of a reaction chamber (3), applying RF power (e.g. at 13.56 MHz and/or 27 MHz) from a power source (25) to one side, and electrically grounding the other side (12), a plasma is excited between the electrodes. A temperature regulator may be provided in a lower stage (2), i.e. the lower electrode. A substrate (1) is placed thereon and its temperature is kept constant at a given temperature. The upper electrode (4) can serve as a shower plate as well, and a reactant gas and/or a dilution gas, if any, as well as a precursor gas can be introduced into the reaction chamber (3) through a first gas line (21) and a second gas line (22), respectively, and through the shower plate (4). Additionally, in the reaction chamber (3), a circular duct (13) with an exhaust line (17) is provided, through which the gas in the interior (11) of the reaction chamber (3) is exhausted. Additionally, a transfer chamber (5) is disposed below the reaction chamber (3) and is provided with a gas seal line (24) to introduce seal gas into the interior (11) of the reaction chamber (3) via the interior (16) of the transfer chamber (5) wherein a separation plate (14) for separating the reaction zone and the transfer zone is provided. Note that a gate valve through which a wafer may be transferred into or from the transfer chamber (5) is omitted from this figure. The transfer chamber is also provided with an exhaust line (6).

Figure 2:
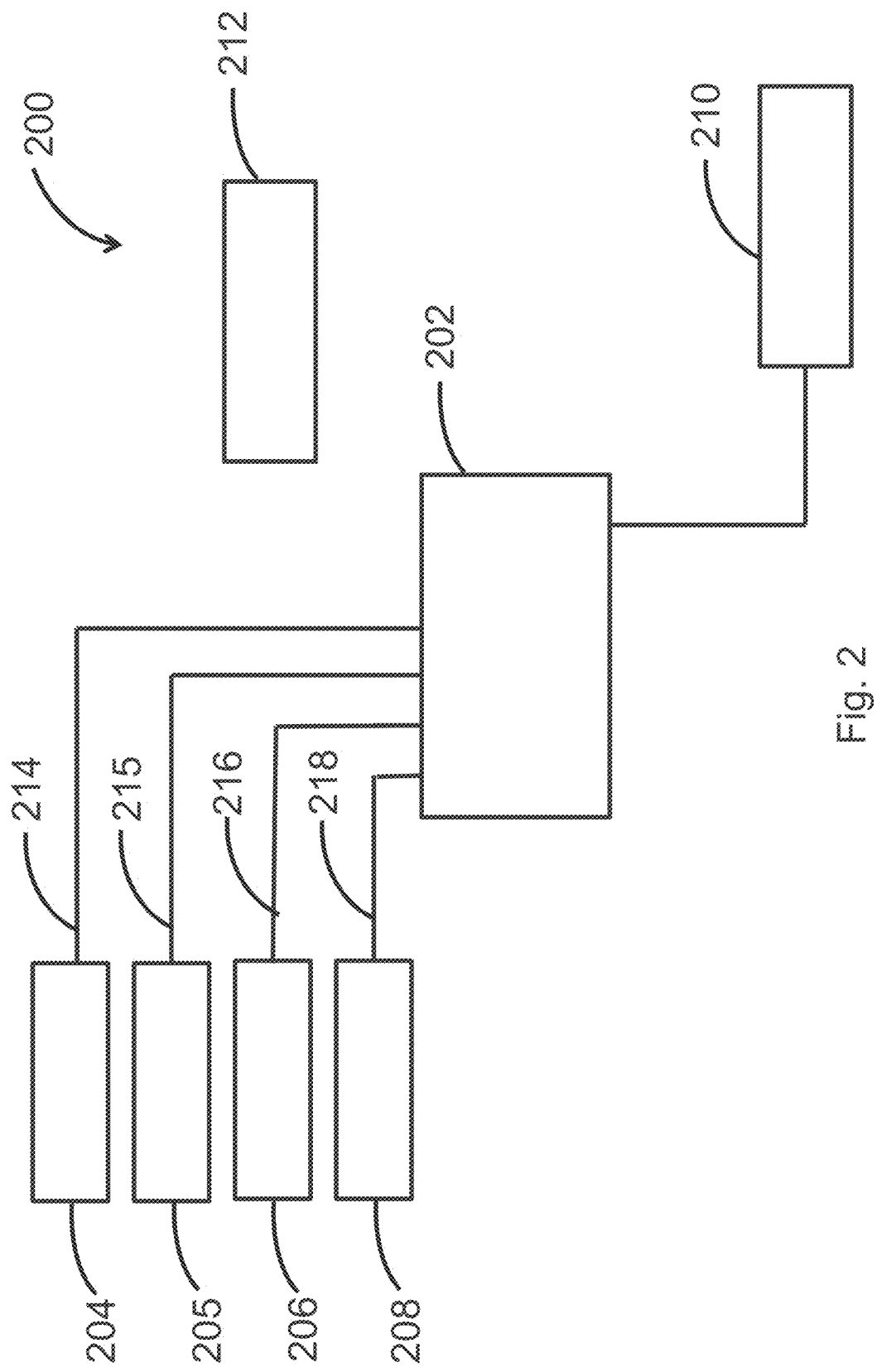
FIG. 2 illustrates a system (200) in accordance with additional exemplary embodiments of the disclosure.

FIG. 2 illustrates a system (200) in accordance with additional exemplary embodiments of the disclosure. The system (200) can be used to perform a method as described herein and/or to form a structure as described herein.

In the illustrated example, the system (200) includes one or more reaction chambers (202), a precursor gas source (204), a reactant gas source (205), and optional further gas sources (206,208). Of course, the system (200) can optionally comprise even more gas sources (not shown). The system further comprises an exhaust (210) and a controller (212).

The reaction chamber (202) can include any suitable reaction chamber, such as an ALD or CVD reaction chamber.

Any one of the gas sources (204-208) can include a vessel and one or more precursors, reactants, or other gasses as described herein. A gas source (204-208) can optionally comprise a mixing unit for mixing precursor with one or more carrier (e.g., noble) gases. A purge gas source (not shown) can, for example, include one or more noble gases as described herein. Although illustrated with four gas sources (204-208), the system (200) can include any suitable number of gas sources. The gas sources (204-208) can be coupled to one or more reaction chambers (202) via lines (214-218), which can include flow controllers, valves, heaters, and the like.

The exhaust (210) can include one or more vacuum pumps.

The controller (212) includes electronic circuitry and software to selectively operate valves, manifolds, heaters, pumps and other components included in the system (200). Such circuitry and components operate to introduce precursors, reactants, and purge gases from the respective sources (204-208). The controller (212) can control timing of gas pulse sequences, temperature of the substrate and/or reaction chamber, pressure within the reaction chamber, and various other operations to provide proper operation of the system (200).

The controller (212) can include control software to electrically or pneumatically control valves to control flow of precursors, reactants and purge gases into and out of the reaction chamber (202). The controller (212) can include modules such as a software or hardware component, e.g., a FPGA or ASIC, which performs certain tasks. A module can advantageously be configured to reside on the addressable storage medium of the control system and be configured to execute one or more processes.

Other configurations of the system (200) are possible, including different numbers and kinds of precursor and reactant sources, and the inclusion of one or more purge gas sources. Further, it will be appreciated that there are many arrangements of valves, conduits, precursor sources, and purge gas sources that may be used to accomplish the goal of selectively feeding gases into the reaction chamber (202). Further, as a schematic representation of a system, many components have been omitted for simplicity of illustration, and such components may include, for example, various valves, manifolds, purifiers, heaters, containers, vents, and/or bypasses.

During operation of the reactor system (200), substrates, such as semiconductor wafers (not illustrated), are transferred from, e.g., a substrate handling system to reaction chamber (202). Once substrate(s) are transferred to reaction chamber (202), one or more gases from the gas sources (204-208), such as precursors, reactants, carrier gases, and/or purge gases, are introduced into the reaction chamber (202).

In some cases, it will be understood that some gasses, such as $O_2$, $N_2$, $H_2$, He, and Ar, are very common and are used throughout a fabrication. Accordingly, they may not be necessarily stored in a vessel inside the tool but may, instead, be provided from a central storage unit (not shown, which may be a pressurized vessel) via gas lines to a system as described herein.

Figure 3A:
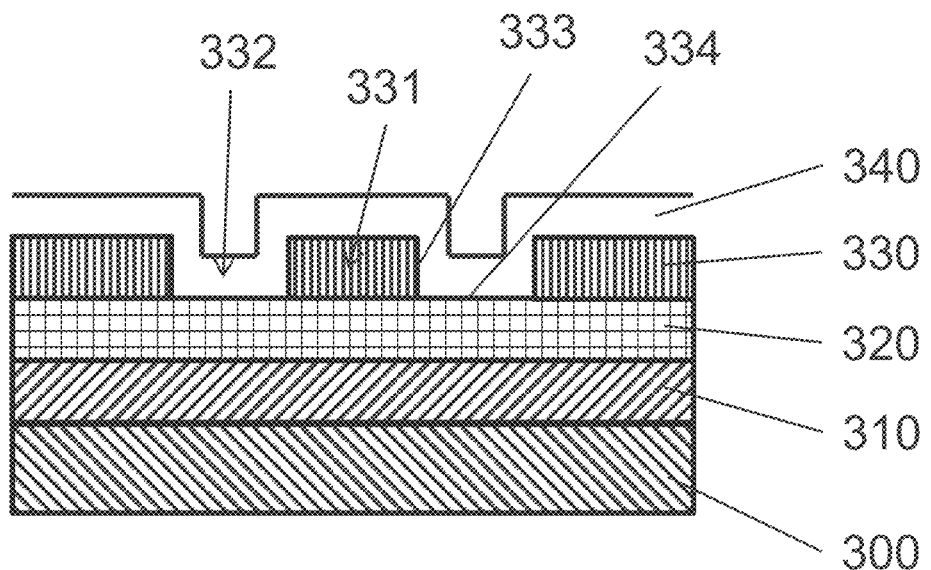
FIGS. 3A and 3B show substrates comprising a liner and a spacer.
Figure 3B:
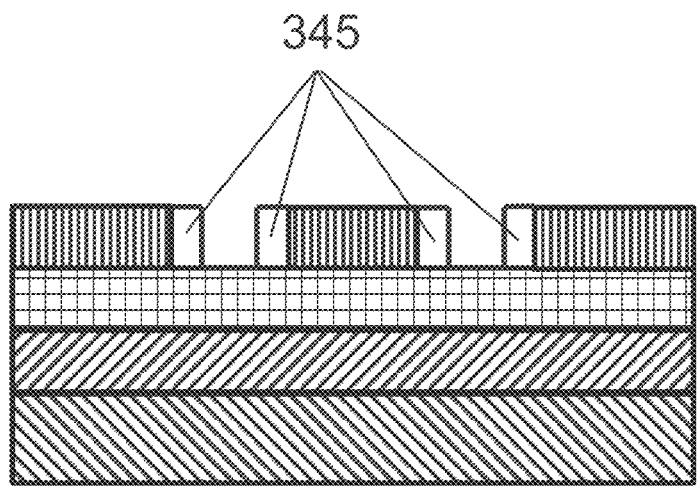

FIGS. 3A and 3B show structures that can be formed by way of embodiments of methods as disclosed herein. The structure of FIG. 3A comprises a substrate (300) on which a hard mask (310) is formed. Suitable substrates include silicon wafers on which one or more patterned or unpatterned layers and structures have been formed. The hard mask (310) can comprise, for example, a metal, a metal alloy, a semiconductor, an alloy of several semiconductors, amorphous carbon, a nitrogen and carbon-containing material, a metal nitride, a metal carbide, a metal oxide, or another suitable material. Suitably, and in some embodiments, the hard mask can have a thickness of at least 1.0 nm to at most 10.0 nm. An underlayer (320) is positioned on the hard mask (310). The underlayer (320) can comprise, for example, a metal such as Sn, Sb or In in addition to oxygen, and carbon. Thus, the underlayer (320) can comprise a metal oxycarbide. Additionally or alternatively, the underlayer (320) can comprise a silicon oxycarbide. The underlayer can have a thickness of less than 10 nm or less than or about 5 nm (such as 2 to 3 nm or more). Overlying the underlayer (320) is a patterned resist (330). Suitably, the patterned resist can comprise an EUV resist as described herein. The patterned resist (330) comprises a plurality of patterned features (331) and a plurality of recesses (332), the plurality of recesses comprise sidewalls (333) and bottom portions (334).

The structure of FIG. 3B is similar to that of FIG. 3A in the sense that it also comprises a substrate (300), hard mask (310), underlayer (320), and patterned resist (330) as described before. The difference lies in the fact that during formation of the structure of FIG. 3B, the liner has been anisotropically etched to form a plurality of spacers (345). The etch was an anisotropic etch as described elsewhere herein that preferably etches material in a direction perpendicular to the substrate. Since the liner is thicker at the sidewalls of the patterned resist, when looked at in a direction perpendicular to the wafer, the anisotropic etch results in formation of the aforementioned spacers structure, and an associated reduction in the width of the aforementioned recesses. Thus, the critical dimension of patterned structures can be advantageously reduced.

Figure 4:
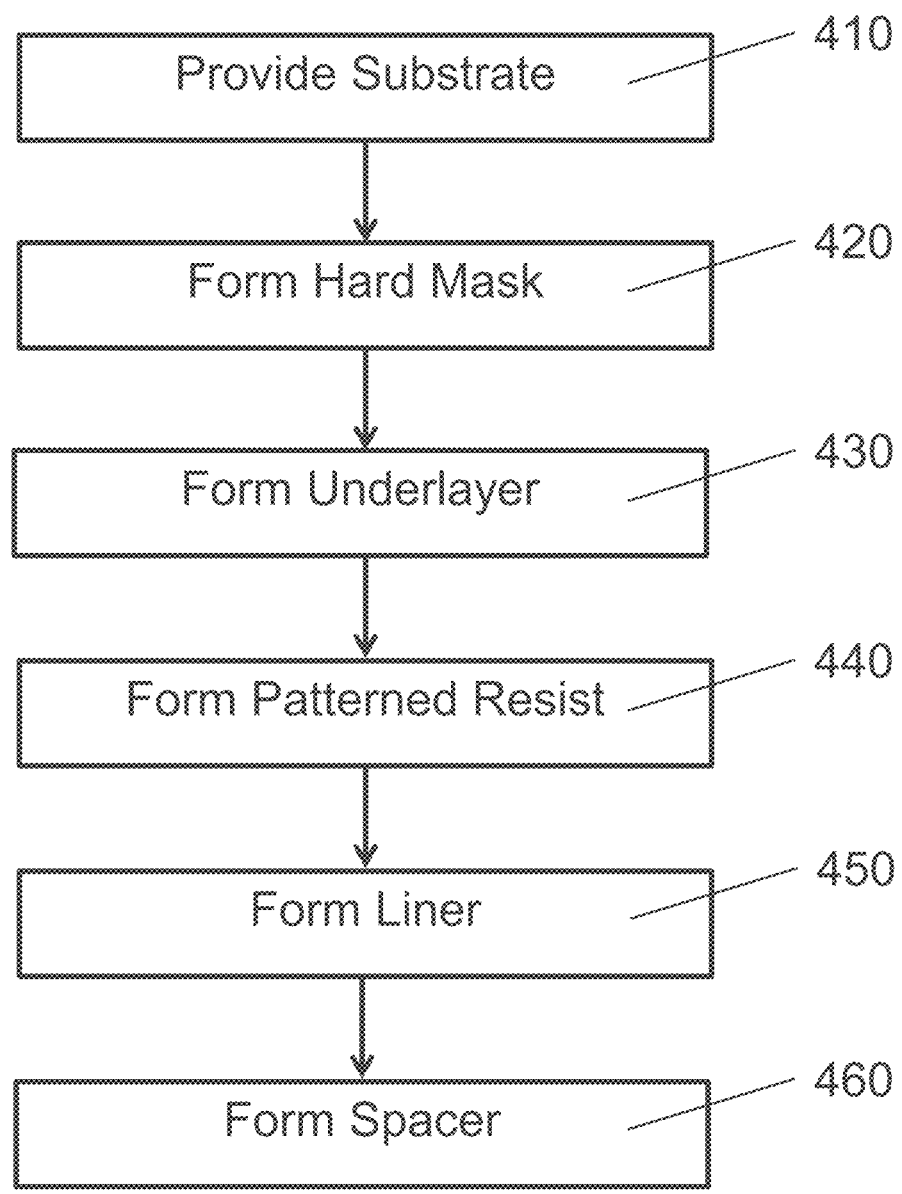
FIG. 4 shows a flow chart of an exemplary patterning process in accordance with certain embodiments of the present disclosure.

FIG. 4 shows a flow chart of an exemplary patterning method in accordance with certain embodiments of the present disclosure. In particular, the method comprises a step (410) of providing a substrate. Then, the method comprises a step (420) of forming a hard mask. Then, the method comprises a step (430) of forming an underlayer. Then, the method comprises a step (440) of forming a patterned resist. Then, the method comprises a step (450) of forming a liner. Then, the method comprises a step (460) of forming a spacer.

Figure 5:
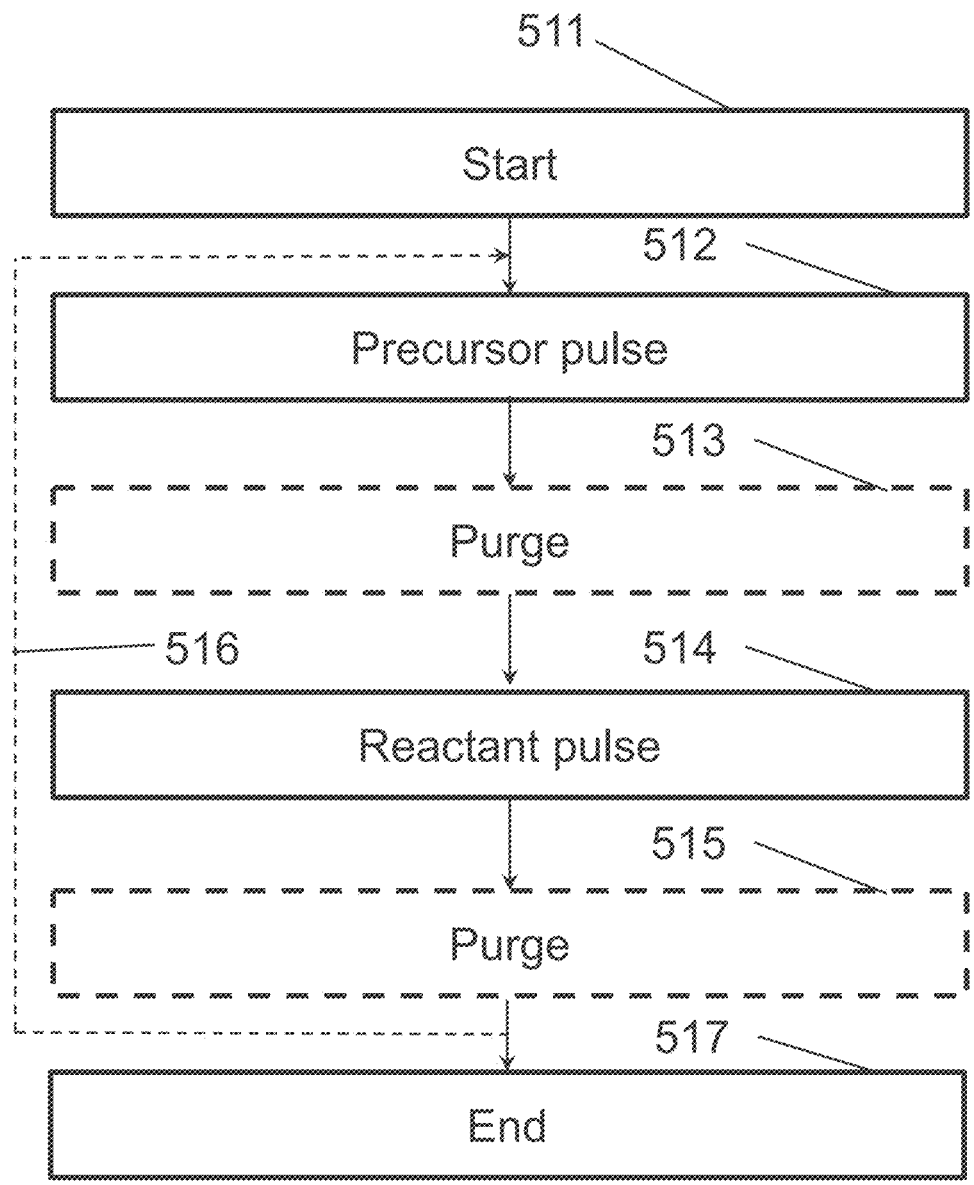
FIGS. 5-8 shows flow charts of processes for forming liners in accordance with certain embodiments of the present disclosure.

FIG. 5 shows a flow chart of an embodiment of a method for forming a liner in accordance with certain embodiments of the present disclosure. This embodiment illustrates a thermal cyclical process of forming a liner, such as an atomic layer deposition process. The method starts (511) with an introduction of a substrate in a reaction chamber. Then, the method comprises a precursor pulse (512) that comprises introducing a precursor in the reaction chamber. Optionally, the reaction chamber is then purged (513) using a purge gas such as a noble gas or another gas that does not substantially react with the precursor or reactant. Then, the method comprises a reactant pulse (514) that comprises providing a reactant to the reaction chamber. Optionally, the reaction chamber is then purged (515) using a purge gas. The precursor pulse (512), the reactant pulse (514), and the optional purge steps (513,515) can optionally be repeated (516) one more time, thus executing one or more deposition cycles. After a pre-determined number of deposition cycles has been executed, the method ends (517).

In an exemplary embodiment of an atomic layer deposition process of forming a liner as described herein the metal precursor comprises tetrakis(dimethylamido)tin, the reactant comprises $H_2O$, the substrate is maintained at a temperature of 125° C., and the reaction chamber is maintained at a pressure of 5 Torr.

In another exemplary embodiment of an atomic layer deposition process of forming a liner as described herein the metal precursor comprises trimethylindium, the reactant comprises $H_2O$, the substrate is maintained at a temperature of 125° C., and the reaction chamber is maintained at a pressure of 5 Torr.

Figure 6:
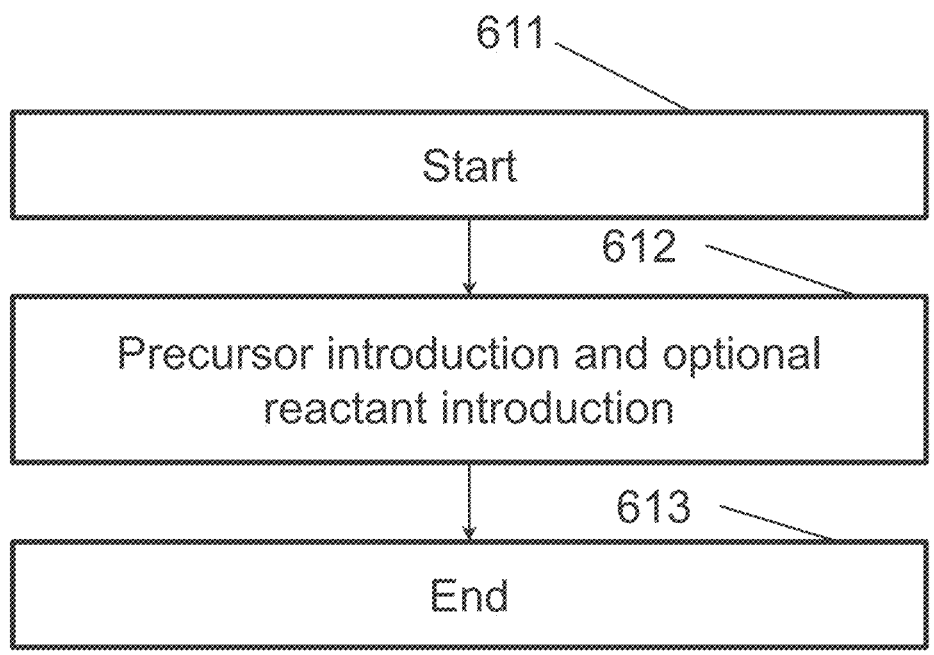

FIG. 6 shows another flow chart of an embodiment of a method for forming a liner in accordance with certain embodiments of the present disclosure. This embodiment illustrates a thermal chemical vapor deposition process of forming a liner. The method starts (611) with an introduction of a substrate in a reaction chamber. Then, the method comprises a step (612) introducing a precursor and optionally introducing a reactant in the reaction chamber. Thus, a liner is formed on the substrate. After the substrate has been exposed to precursor and optionally to reactant for a pre-determined amount of time, the method ends (613).

Figure 7:
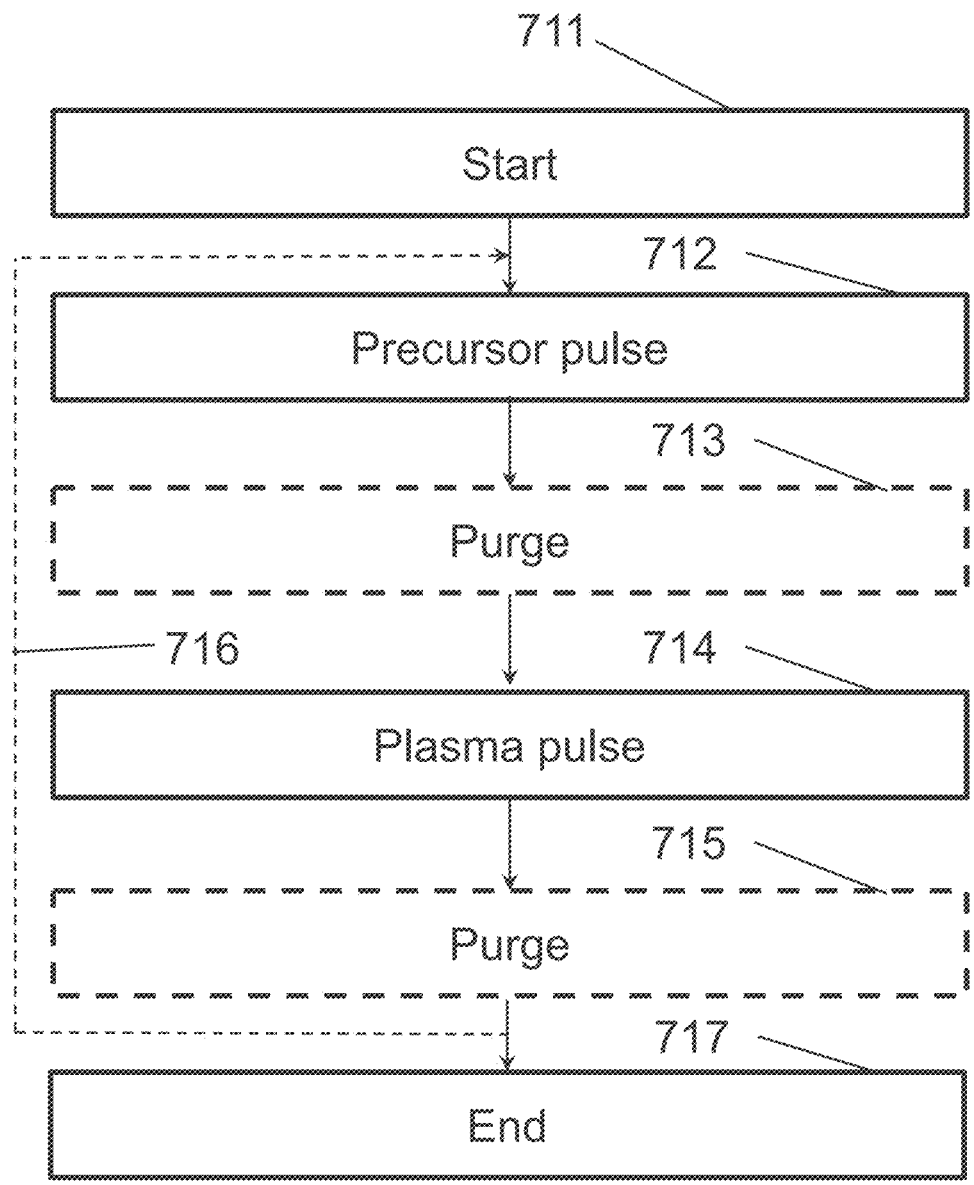

FIG. 7 shows a flow chart of another embodiment of a method for forming a liner in accordance with certain embodiments of the present disclosure. This embodiment illustrates a cyclical process of forming a liner. In this embodiment, the cyclical process comprises generating a plasma such as a remote plasma, an indirect plasma, or a direct plasma. Suitable plasma-enhanced processes include plasma-enhanced and radical-enhanced atomic layer deposition process. The method starts (711) with an introduction of a substrate in a reaction chamber. Then, the method comprises a precursor pulse (712) that comprises introducing a precursor in the reaction chamber. Optionally, the reaction chamber is then purged (713) using a purge gas such as a noble gas or another gas that does not substantially react with the precursor. Then, the method comprises a plasma pulse (714) that comprises generating plasma. The plasma can be generated in the reaction chamber itself without any separators between the plasma and the substrate, which is called a direct plasma configuration. Alternatively, the plasma can be generated in the reaction chamber itself with a separator between the plasma and the substrate, which is called an indirect plasma chamber. As yet another alternative, the plasma can be generated in a separate plasma chamber which is located at a certain distance, e.g. of at least 0.2 m, from the reaction chamber; which is called a remote plasma configuration. Regardless of the specific configuration, the plasma pulse (714) comprises exposing the substrate to plasma-generated species such as ions or radicals. Optionally, the reaction chamber is then purged (715) using a purge gas. The precursor pulse (712), the plasma pulse (714), and the optional purge steps (713, 715) can optionally be repeated (716) one more time, thus executing one or more deposition cycles. After a pre-determined number of deposition cycles has been executed, the method ends (717).

Figure 8:
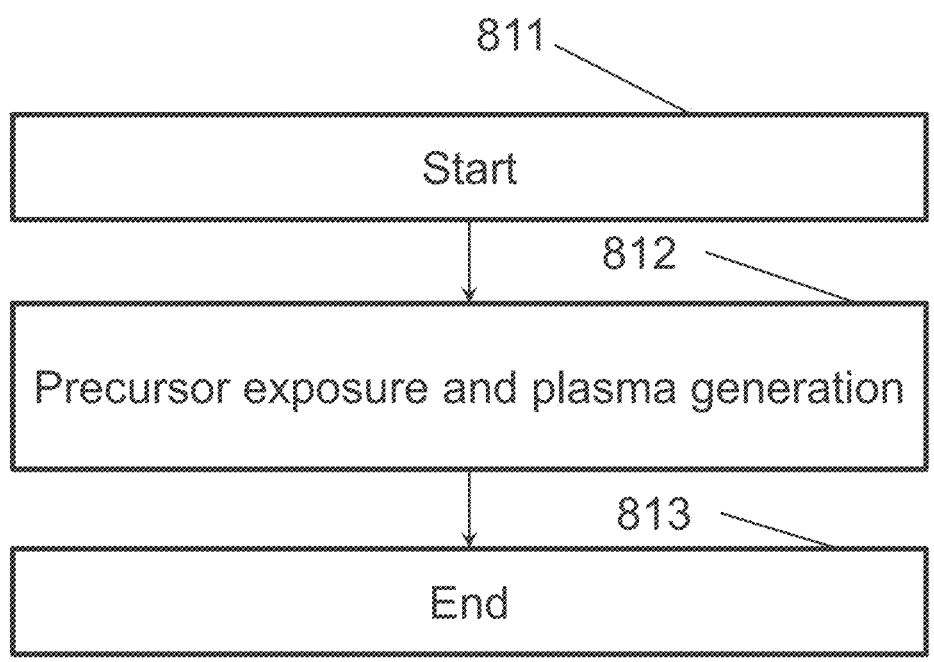

FIG. 8 shows yet another flow chart of an embodiment of a method for forming a liner in accordance with certain embodiments of the present disclosure. This embodiment illustrates a plasma-enhanced chemical vapor deposition process of forming a liner. The method starts (811) with an introduction of a substrate in a reaction chamber. Then, the method comprises a step (812) introducing a precursor in the reaction chamber while generating a plasma. Various plasma configurations are possible such as the direct, indirect, and remote plasma configurations described herein. Thus, a liner is formed on the substrate. After precursor exposure and plasma generation has occurred for a pre-determined amount of time, the method ends (813).

Figure 9A:
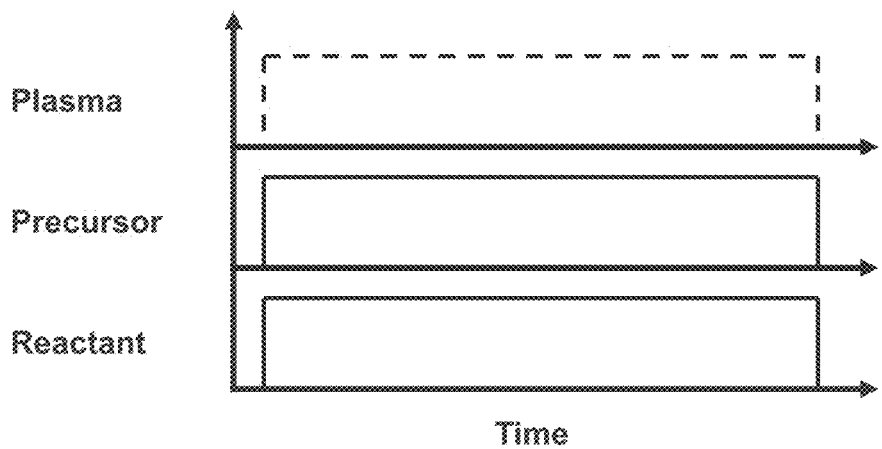
FIGS. 9A-9C and 10A-10B show exemplary pulsing schemes for use in methods according to certain embodiments of the present disclosure.
Figure 9B:
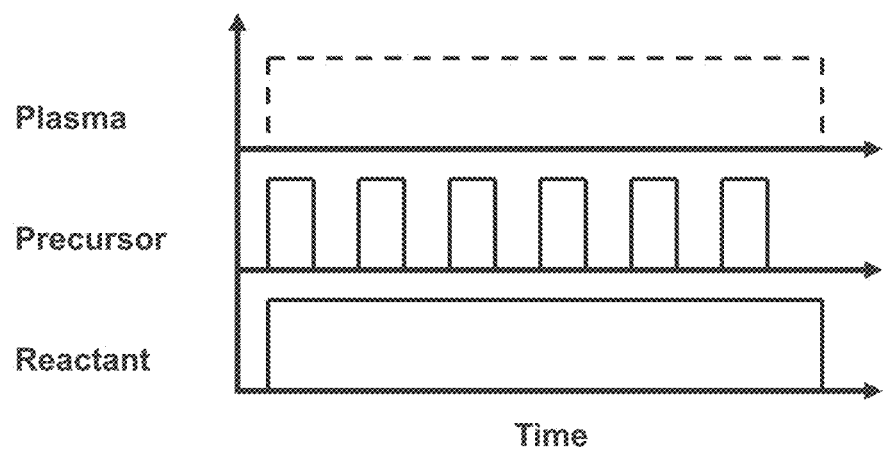
Figure 9C:
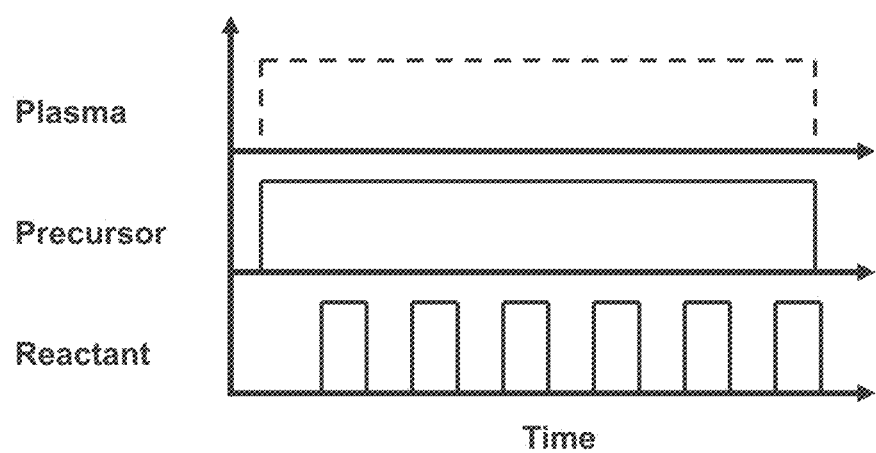

FIGS. 9A, 9B, and 9C show exemplary pulsing schemes that can be used for forming liners in one or more embodiments of methods as described herein. In each of these embodiments, a plasma can be optionally generated, and could be used, for example in a direct, indirect, or remote configuration. The plasma can be operated continuously or in a pulsed manner. FIG. 9A shows a flow scheme in which precursor and reactant are continuously provided to the reaction chamber, i.e. there is no pulsing of precursor or reactant flow. Both thermal and plasma-enhanced chemical vapor deposition methods can employ such a continuous precursor or reactant provision. FIG. 9B shows a flow scheme in which precursor flow is pulsed and reactant flow is continuous. FIG. 9C shows a pulsing scheme in which precursor flow is continuous and reactant flow is pulsed. The flow schemes of FIGS. 9B and 9C can be used in pulsed thermal or plasma-enhanced chemical vapor deposition approaches of forming a liner.

Figure 10A:
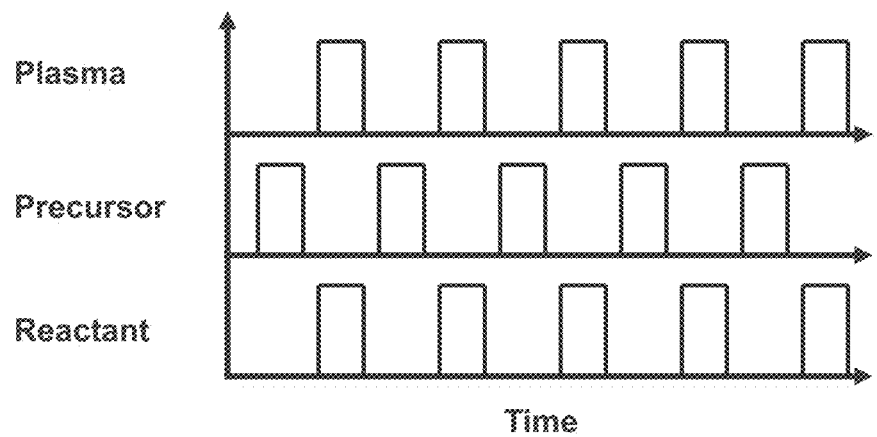
Figure 10B:
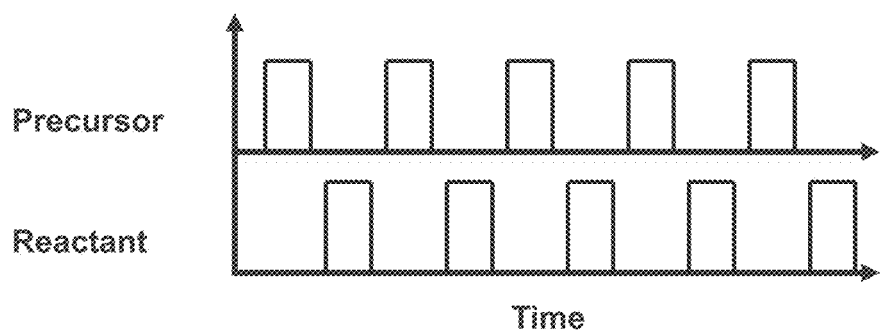
Figure 11:
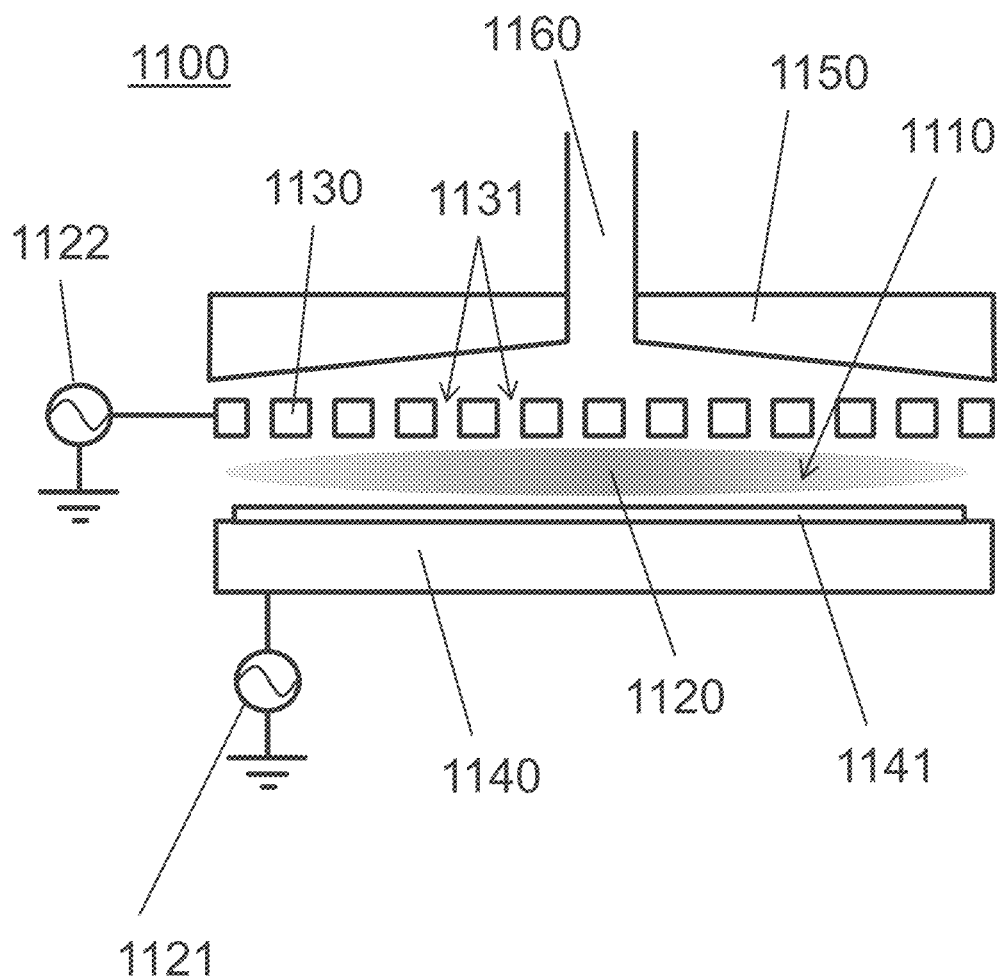
FIGS. 11-13 show exemplary systems for use in methods according to certain embodiments of the present disclosure.

FIGS. 10A and 10B show further exemplary pulsing schemes that can be used for forming liners in one or more embodiments of methods as described herein. In both the embodiments of FIGS. 10A and 10B, the substrate is exposed to precursor and reactant in non-overlapping precursor pulses and reactant pulses, respectively. Optionally, the precursor pulses and the reactant pulses are separated by purges. In some embodiments (not shown) the precursor and reactant pulses partially overlap. In the embodiment of FIG. 10A, a plasma is generated, and could be used, for example, in a direct, indirect, or remote configuration. During the plasma pulses, the substrate is exposed to plasma-generated active species such as ions or radicals. In some embodiments, the plasma pulses at least partially overlap with at least one of the precursor purses and the reactant pulses. In the embodiment shown, the plasma pulses overlap with the reactant pulses, i.e. the plasma is generated at the same time as the reactant is provided. The embodiment of FIG. 10B shows a thermal process in which no plasma is used for forming the liner. FIG. 11 shows a schematic representation of an embodiment of a direct plasma system (1100) that is operable or controllable to perform the fabrication processes or methods as described herein. The system (1100) includes a reaction chamber (1110) in which a plasma (1120) is generated. In particular, the plasma (1120) is generated between a showerhead injector (1130) and a substrate support (1140) supporting a substrate or wafer (1141).

In the configuration shown, the system (1100) includes two alternating current (AC) power sources: a high frequency power source (1121) and a low frequency power source (1122). In the configuration shown, the high frequency power source (1121) supplies radio frequency (RF) power to the showerhead injector, and the low frequency power source (1122) supplies an alternating current signal to the substrate support (1140). The radio frequency power can be provided, for example, at a frequency of 13.56 MHz or higher. The low frequency alternating current signal can be provided, for example, at a frequency of 2 MHz or lower.

Process gas comprising precursor, reactant, or both, is provided through a gas line (1160) to a conical gas distributor (1150). The process gas then passes via through holes (1131) in the showerhead injector (1130) to the reaction chamber (1110). Whereas the high frequency power source (1121) is shown as being electrically connected to the showerhead injector and the low frequency power source (1122) is shown as being electrically connected to the substrate support (1140), other configurations are possible as well. For example, in some embodiments (not shown), both the high frequency power source and the low frequency power source can be electrically connected to the showerhead injector; both the high frequency power source and the low frequency power source can be electrically connected to the substrate support; or both the high frequency power source can be electrically connected to the substrate support, and the low frequency power source can be electrically connected to the showerhead injector.

Figure 12:
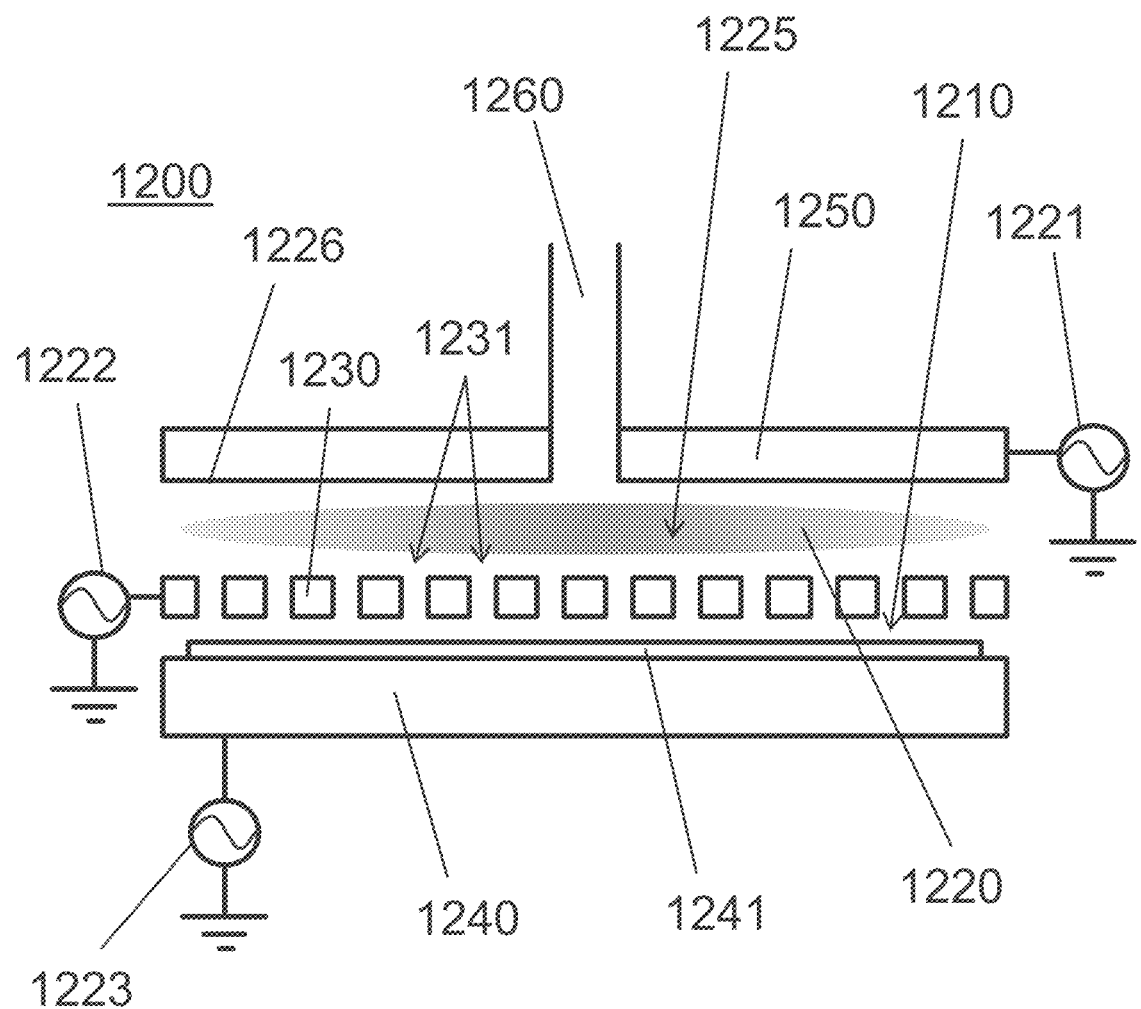

FIG. 12 shows a schematic representation of another embodiment of an indirect plasma system (1200) operable or controllable to perform the methods as described herein. The system (1200) includes a reaction chamber (1210), which is separated from a plasma generation space (1225) in which a plasma (1220) is generated. In particular, the reaction chamber (1210) is separated from the plasma generation space (1225) by a showerhead injector (1230), and the plasma (1220) is generated between the showerhead injector (1230) and a plasma generation space ceiling (1226).

In the configuration shown, the system (1200) includes three alternating current (AC) power sources: a high frequency power source (1221) and two low frequency power sources (1222), (1223) (i.e., a first low frequency power source (1222) and a second low frequency power source (1223)). In the configuration shown, the high frequency power source (1221) supplies radio frequency (RF) power to the plasma generation space ceiling, the first low frequency power source (1222) supplies an alternating current signal to the showerhead injector (1230), and the second low frequency power source (1223) supplies an alternating current signal to the substrate support (1240). A substrate (1241) is provided on the substrate support (1240). The radio frequency power can be provided, for example, at a frequency of 13.56 MHz or higher. The low frequency alternating current signal of the first and second low frequency power sources (1222), (1223) can be provided, for example, at a frequency of 2 MHz or lower.

Process gas comprising precursor, reactant, or both, is provided through a gas line (1260) that passes through the plasma generation space ceiling (1226) to the plasma generation space (1225). Active species such as ions and radicals generated by the plasma (1220) from the process gas pass via through holes (1231) in the showerhead injector (1230) to the reaction chamber (1210).

Figure 13:
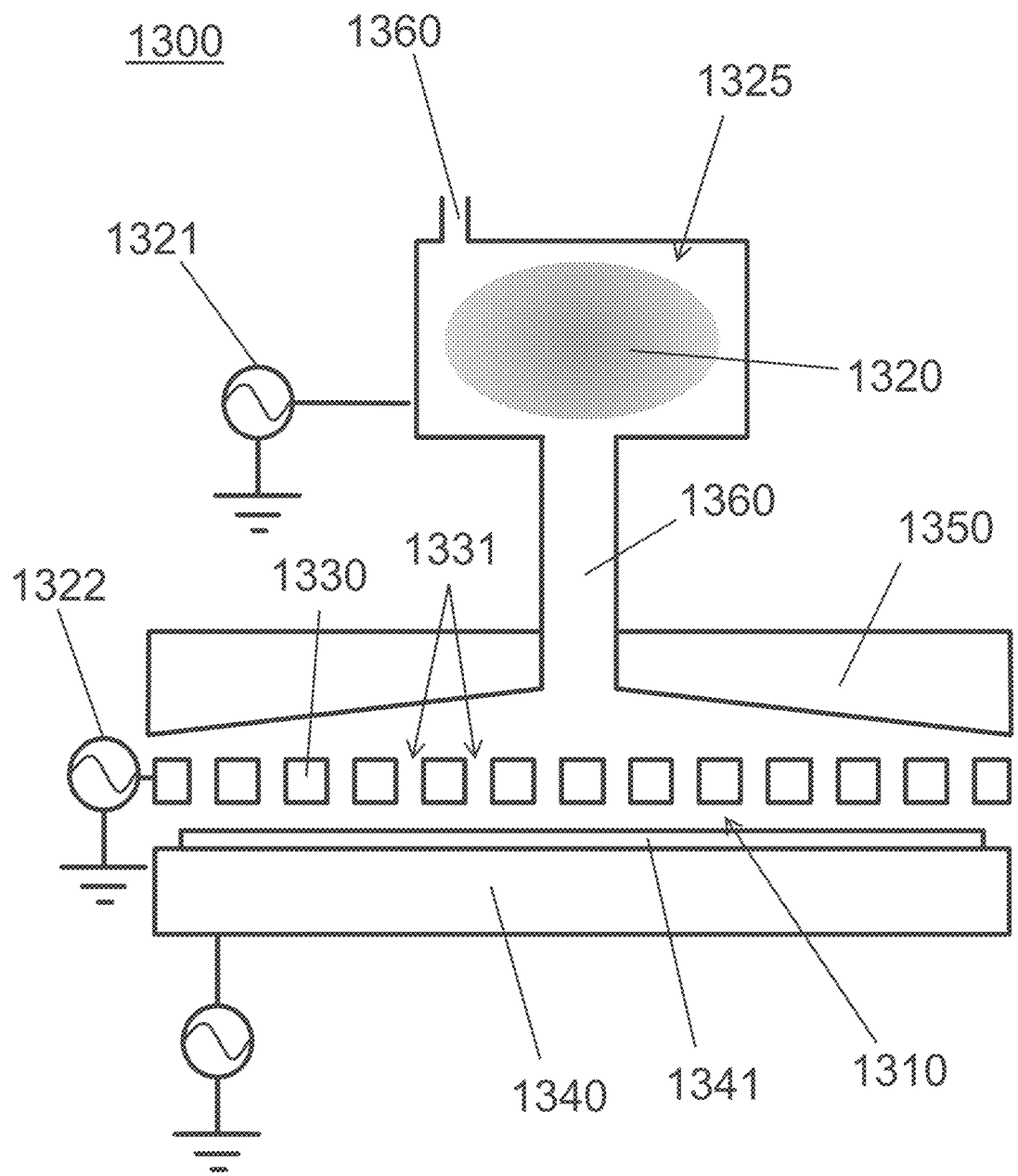

FIG. 13 shows a schematic representation of an embodiment of a remote plasma system (1300) operable or controllable to perform the fabrication methods or processes as described herein. The system (1300) includes a reaction chamber (1310), which is operationally connected to a remote plasma source (1325) in which a plasma (1320) is generated. Any sort of plasma source can be used as a remote plasma source (1325), for example an inductively coupled plasma, a capacitively coupled plasma, or a microwave plasma. In particular, active species are provided from the plasma source (1325) to the reaction chamber (1310) via an active species duct (1360) to a conical distributor (1350) via through holes (1331) in a shower plate injector (1330) to the reaction chamber (1310). Thus, active species can be provided to the reaction chamber in a uniform way.

In the configuration shown, the system (1300) includes three alternating current (AC) power sources: a high frequency power source (1321) and two low frequency power sources (1322, 1323) (e.g., a first low frequency power source (1322) and a second low frequency power source (1323)). In the configuration shown, the high frequency power source (1321) supplies radio frequency (RF) power to the plasma generation space ceiling, the first low frequency power source (1322) supplies an alternating current signal to the showerhead injector (1330), and the second low frequency power source (1323) supplies an alternating current signal to the substrate support (1340). A substrate (1341) is provided on the substrate support (1340). The radio frequency power can be provided, for example, at a frequency of 10 MHz or higher. The low frequency alternating current signal of the first and second low frequency power sources (1322), (1323) can be provided, for example, at a frequency of 2 MHz or lower.

In some embodiments (not shown), an additional high frequency power source can be electrically connected to the substrate support. Thus, a direct plasma can be generated in the reaction chamber. Process gas comprising precursor, reactant, or both, is provided to the plasma source (1325) by means of a gas line (1360). Active species such as ions and radicals generated by the plasma (1320) from the process gas are guided to the reaction chamber (1310).

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

We claim:

1. A method for forming a structure, the method comprising the steps of:
   providing a substrate to a reaction chamber, the substrate comprising a patterned resist, the patterned resist comprising a first metal, the patterned resist further comprising a plurality of patterned features and a plurality of recesses, the plurality of recesses comprising sidewalls and bottom portions; and
   forming a liner on the sidewalls, wherein the liner comprises a second metal.

2. A method for forming a pattern on a substrate, the method comprising the steps of:
   forming a resist on a substrate, the resist comprising a first metal;
   partially exposing the substrate to radiation through a mask, thereby forming exposed resist portions and unexposed resist portions;
   selectively removing one of the exposed resist portions and unexposed resist portions, thereby forming a patterned resist, the patterned resist comprising the first metal, the patterned resist further comprising a plurality of patterned features and a plurality of recesses, the plurality of recesses comprising sidewalls and bottom portions;
   providing the substrate to a reaction chamber; and
   forming a liner on the sidewalls, wherein the liner comprises a second metal.

3. The method according to claim 2, wherein the resist comprises an EUV resist and the radiation comprises EUV radiation.

4. The method according to claim 1, wherein the first metal and the second metal are the same.

5. The method according to claim 1, wherein the liner is further formed on the patterned features and the bottom portions of the recesses.

6. The method according to claim 5, wherein the step of forming the liner is further followed by etching the liner, thereby removing the liner from the patterned features and the bottom portions of the recesses, and forming spacers on the sidewalls.

7. The method according to claim 6, wherein at least one of the first metal and the second metal is selected from Sn, In, Sb, Ti, Al, Zn, Hf, and Zr.

8. The method according to claim 1, wherein the liner and the resist have a substantially identical composition.

9. The method according to claim 1, wherein the liner and the resist have a substantially identical etch rate.

10. The method according to claim 1, wherein at least one of the resist and the liner comprise one or more of a pnictogen, a chalcogen, and a halogen.

11. The method according to claim 10, wherein the resist and the liner comprise the same metal oxide.

12. The method according to claim 1, wherein forming the liner comprises providing a precursor and a reactant to the reaction chamber.

13. The method according to claim 12, wherein forming the liner comprises forming a plasma.

14. The method according to claim 12, wherein the precursor and the reactant are simultaneously provided to the reaction chamber.

15. The method according to claim 12, wherein forming the liner comprises a cyclical process, wherein the cyclical process comprises a precursor pulse and a reactant pulse, wherein the precursor pulse comprises exposing the substrate to the precursor, and wherein the reactant pulse comprises exposing the substrate to the reactant.

16. The method according to claim 12, wherein the precursor comprises at least one of a metal alkylamine, a metal alkyl, and a metal halide.

17. The method according to claim 12, wherein the reactant comprises oxygen.

* * * * *